(12) United States Patent
Mizuno

(10) Patent No.: US 6,350,945 B1
(45) Date of Patent: Feb. 26, 2002

(54) THIN FILM SEMICONDUCTOR DEVICE AND METHOD OF MANUFACTURING THE SAME

(75) Inventor: Shinichi Mizuno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/542,697

(22) Filed: Apr. 4, 2000

(30) Foreign Application Priority Data

Apr. 5, 1999 (JP) .......................................... 11-097696

(51) Int. Cl.[7] ........................................... H01L 31/052
(52) U.S. Cl. ...................... 136/246; 136/256; 136/259; 257/436; 438/72; 438/71
(58) Field of Search ................................ 136/246, 256, 136/259; 257/436; 438/72, 71

(56) References Cited

U.S. PATENT DOCUMENTS

| 3,973,994 | A |   | 8/1976  | Redfield         |         |
|-----------|---|---|---------|------------------|---------|
| 4,328,390 | A | * | 5/1982  | Meakin et al.    | 136/259 |
| 4,398,056 | A | * | 8/1983  | Sheng            | 136/259 |
| 4,419,533 | A |   | 12/1983 | Czubatyi et al.  |         |
| 5,453,135 | A | * | 9/1995  | Nakagawa et al.  | 136/259 |
| 5,503,898 | A | * | 4/1996  | Lauf             | 428/149 |
| 5,711,824 | A | * | 1/1998  | Shinohara et al. | 136/259 |

FOREIGN PATENT DOCUMENTS

| DE | 4033545 A    | 4/1992 |
| EP | 0175460 A    | 3/1986 |
| EP | 0297437 A2   | 1/1989 |
| WO | WO9214270 A1 | 8/1992 |
| WO | WO9909601 A1 | 2/1999 |

OTHER PUBLICATIONS

European Search Report dated Mar. 22, 2001.

* cited by examiner

Primary Examiner—Alan Diamond
(74) Attorney, Agent, or Firm—Sonnenschein, Nath & Rosenthal

(57) ABSTRACT

A thin film semiconductor device capable of improving the optical absorption efficiency of a single crystal silicon thin film solar battery or the like and thus improving the photoelectric conversion efficiency. A transparent thin plastic film substrate is located on a surface of each solar battery element, opposite to a plastic film substrate. A diffraction grating is located between the plastic film substrate and the solar battery elements. The diffraction grating has a reflection-type blazed grating structure made of a conductive material such as aluminum (Al). Incident light is diffracted by the diffraction grating and returns to the solar battery element. When a diffraction angle is more than a predetermined value, an angle between the diffracted light and a normal to the solar battery increases. Thus, the light is totally reflected by a top surface of a silicon thin film layer (the solar battery element) or the surface of the transparent plastic film substrate and returns to the solar battery element.

10 Claims, 7 Drawing Sheets

λ = 900nm
k = 0.0027

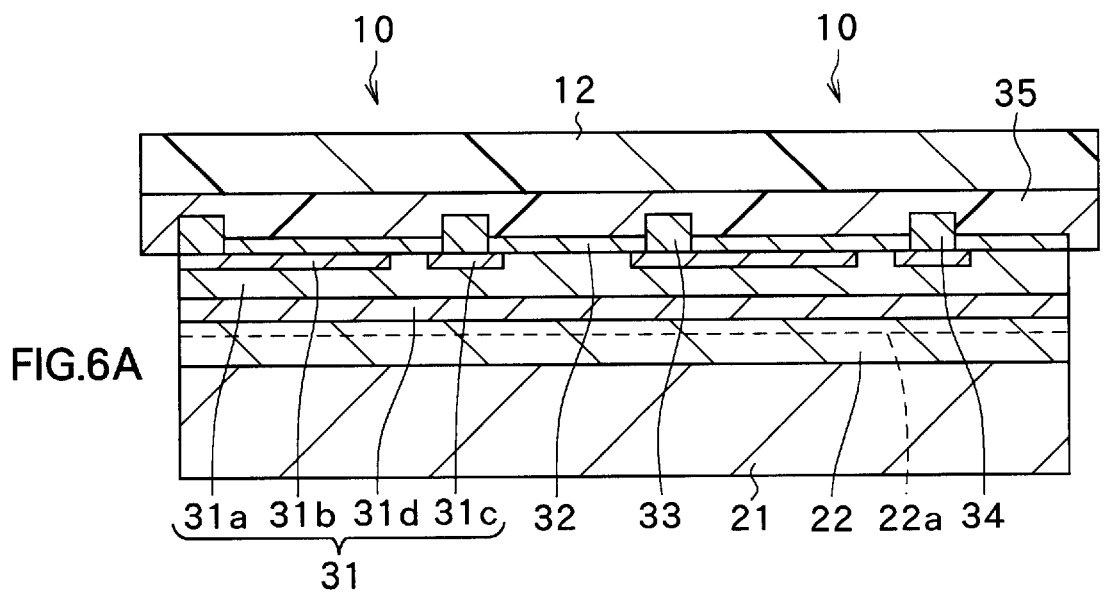
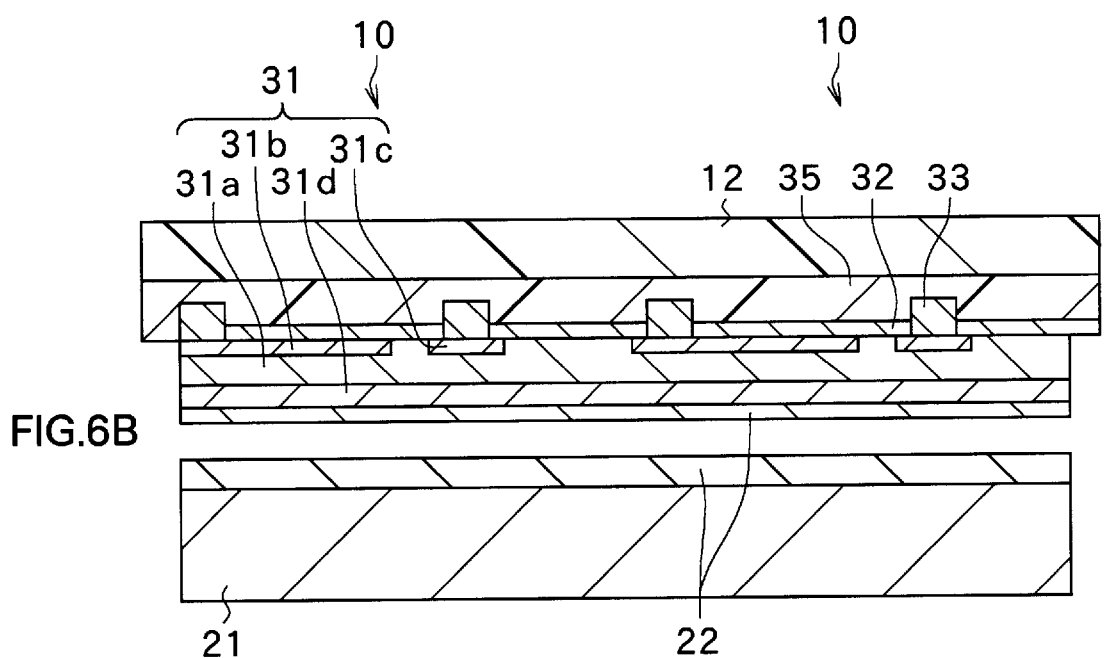

THIN FILM SEMICONDUCTOR DEVICE AND METHOD OF MANUFACTURING THE SAME

RELATED APPLICATION DATA

The present application claims priority to Japanese Application No. P11-097896 filed Apr. 5, 1999 which application is incorporated herein by reference to the extent permitted by law.

BACKGROUND OF THE INVENTION

1. Field of the Invention

The invention relates to a thin film semiconductor device such as a thin film solar battery made of a silicon thin film, a semiconductor such as CIS, or an organic material such as a conductive polymer and a method of manufacturing the same.

2. Description of the Related Art

Recently, solar batteries have been put to practical use in some field. Resource saving and cost reduction are important in order that the solar battery may be widely and generally used. Moreover, a thin film solar battery is more desirable than a thick film solar battery for an improvement in energy conversion (photoelectric conversion) efficiency, a reduction in the number of years for energy recovery, and so on. Furthermore, the thin film solar battery has an advantage of having a wide range of applications. That is because the thin film solar battery can be bent to some extent and thus it can be mounted on, for example, a curved surface of a body of an automobile or an outer curved surface of a portable electrical appliance to generate electric power.

The applicant of the invention has previously proposed the following method as a preferred method for manufacturing a thin film solar battery (Japanese Patent Laid-open Nos. Hei 8-213645 and Hei 10-135500). The method includes: forming a porous layer as an isolation layer on a single crystal silicon substrate; growing a semiconductor layer made of thin film single crystal silicon for functioning as a solar battery on the porous layer; then bonding a thin plastic plate to the semiconductor layer with an adhesive; and then peeling the semiconductor layer together with the plastic plate from the single crystal silicon substrate.

On the other hand, a technique for improving conversion efficiency of such a thin film solar battery is that a texture structure having fine protrusions is made on a silicon substrate and a solar cell is made on the texture structure, whereby light is confined within the solar battery. However, when the fine protrusions are formed on the surface of the substrate and the solar battery is formed on the fine protrusions, a problem exists: a short-circuit current value does not increase much in spite of a considerable reduction in reflectance on the surface of the substrate. A further improvement is therefore desired.

Moreover, there is a method for improving efficiency of a solar battery. In the method, sunlight is scattered by a texture structure made on a rear surface of a thin film solar battery, whereby part of the light is emitted again from the solar battery, part of the light is totally reflected by the surface of the solar battery and the reflected light is again scattered by the texture structure on a bottom surface. Thus, a distance of transmission of the light through the solar battery is increased, and consequently the efficiency of the solar battery is improved. However, the method has another problem: a direction of light scattering is irregular because of a random texture structure and therefore it is substantially impossible to eliminate the light emitting from the solar battery.

A solar battery having another structure is also manufactured. The structure has a reflecting mirror which is made by coating the bottom surface of the solar battery with a reflecting material such as aluminum (Al), wherein the light passing through the solar battery is returned to the solar battery by the reflecting mirror. However, the structure has still another problem. That is, most of the light that is reflected and thus returned to the solar battery, except the light reflected by the surface of the solar battery, again emits from the solar battery into the air, and therefore the conversion efficiency cannot be sufficiently increased.

On the other hand, a single crystal silicon thin film solar battery not using a silicon substrate can save a silicon material, and thus this solar battery is important from the viewpoint of manufacturing costs and resource saving. However, because of a thin silicon film, a considerable amount of incident light is not absorbed by the silicon film but passes through the silicon film. Thus, the single crystal silicon thin film solar battery has a further problem of being unable to obtain high efficiency of electric power generation. For example, when the light has a wavelength of 800 nm and the silicon thin film has a thickness of 10 $\mu$m, silicon has the optical absorption efficiency of 67%. Optical absorption of silicon is maximized at a wavelength of about 200 nm, while the optical absorption monotonously decreases with increasing wavelength. Accordingly, the light with wavelengths longer than 800 nm substantially passes through the silicon thin film, and thus the photoelectric conversion efficiency decreases.

SUMMARY OF THE INVENTION

The invention is designed to overcome the foregoing problems. It is an object of the invention to provide a thin film semiconductor device and a method of manufacturing the same capable of improving the optical absorption efficiency of a single crystal silicon thin film or the like and thus improving the photoelectric conversion efficiency.

A thin film semiconductor device of the invention comprises: a photoelectric conversion layer for converting incident light into an electric signal; and a diffraction function layer located on one side of the photoelectric conversion layer opposite to the other side on which the light is incident, for reflecting the light passing through the photoelectric conversion layer toward the photoelectric conversion layer.

A method of manufacturing a thin film semiconductor device of the invention comprises the steps of: pressing a master of the diffraction function layer on a transparent thermoplastic resin layer or a transparent thermosetting resin layer and thereby transferring a grating shape to the resin layer, and then filling a light reflecting material into a transfer surface of the resin layer, thereby forming a reflection-type diffraction function layer; and bonding the diffraction function layer to one surface of the photoelectric conversion layer opposite to the other surface on which the light is incident.

In the thin film semiconductor device of the invention, the light passing through the photoelectric conversion layer is reflected toward the photoelectric conversion layer by the diffraction function layer, and the reflected light again enters into the photoelectric conversion layer. A condition under which the reflected light is totally reflected toward the photoelectric conversion layer is set, whereby the light is confined within the photoelectric conversion layer and thus the photoelectric conversion efficiency is improved.

In the method of manufacturing a thin film semiconductor device of the invention, the master of the diffraction function layer is pressed on transparent thermoplastic resin or transparent thermosetting resin. The grating shape is transferred to the resin layer. Then, the light reflecting material such as aluminum (Al) is filled into the transfer surface of the resin layer, whereby the reflection-type diffraction function layer is formed. The reflection-type diffraction function layer is located on one surface of the photoelectric conversion layer opposite to the other surface on which the light is incident, with the resin layer sandwiched therebetween.

Other and further objects, features and advantages of the invention will appear more fully from the following description.

BRIEF DESCRIPTION OF THE DRAWINGS

FIGS. 6A and 6B are cross sectional views of processes following the process of FIG. 5D;

DETAILED DESCRIPTION OF THE PREFERRED EMBODIMENTS

Embodiments of the invention will be described in detail below with reference to the accompanying drawings.

[First Embodiment]

Figure 1:
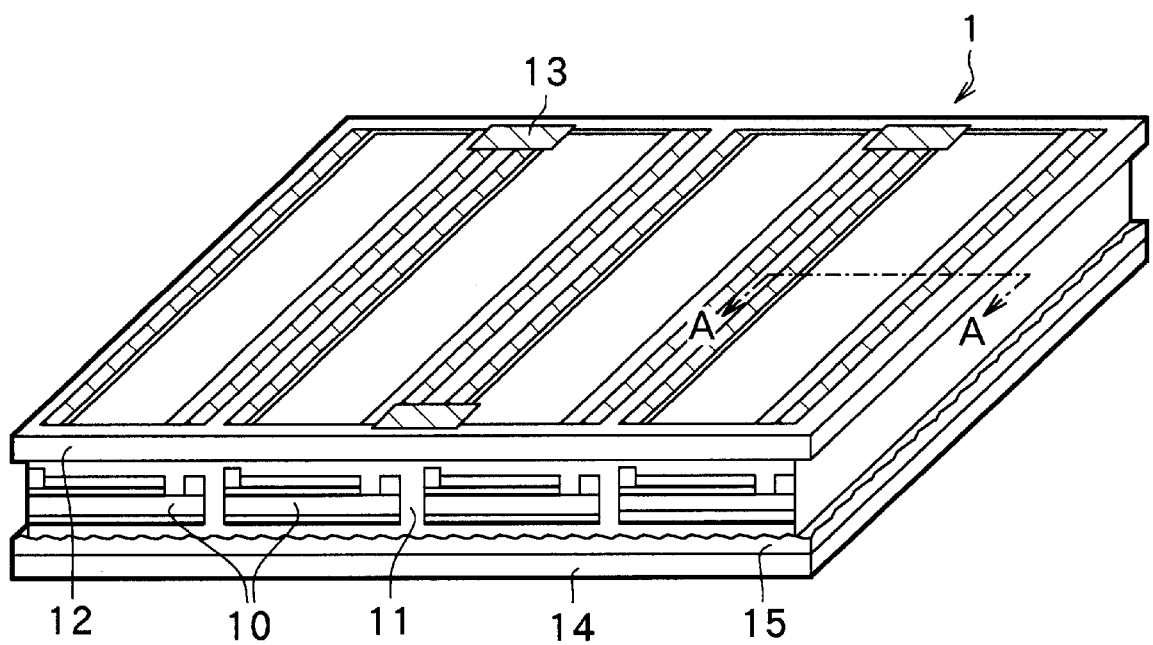
FIG. 1 is a perspective view for illustrating the overall configuration of an integrated solar battery according to a first embodiment of the invention.
Figure 2:
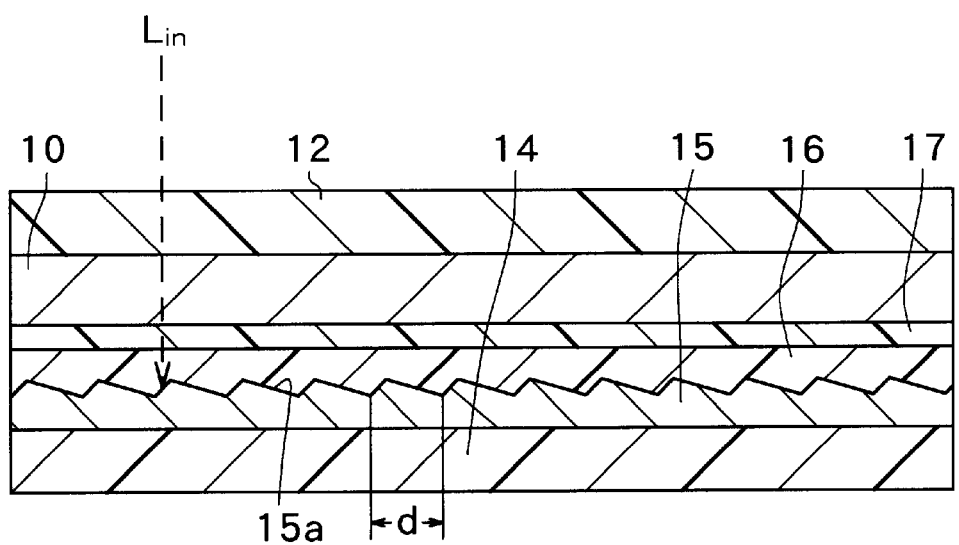
FIG. 2 is a cross sectional view for illustrating a principal structure of the solar battery shown in FIG. 1.

FIG. 1 shows a configuration of an integrated solar battery 1 according to a first embodiment of the invention. FIG. 2 shows a sectional structure taken along line A-A of the integrated solar battery 1 shown in FIG. 1, partly in a schematic view and on an enlarged scale.

The integrated solar battery 1 comprises a unidirectional (horizontal in FIG. 1) array of a plurality of solar cell 10 electrically connected to one another. Each of the solar cell 10 comprises a single crystal silicon layer of about 1 $\mu$m to 10 $\mu$m thick, for example, and an n type layer and a p type layer formed on the single crystal silicon layer. One surface of each of the solar cell 10, i.e., the surface on which the light is incident (hereinafter referred to as a front surface) is bonded to a transparent, flexible and thin plastic film substrate 12, for example. The plastic film substrate 12 functions as a protective layer for preventing damage to the solar cell 10. The plastic film substrate 12 is made of, for example, ethylene vinylacetate (EVA), and has a refractive index of 1.5, for instance.

The adjacent solar cell 10 are electrically isolated from each other by an element isolation layer 11 formed along a direction perpendicular to the direction of the array of the elements. The element isolation layer 11 is made of a flexible insulating material, e.g., ethylene vinylacetate. The adjacent solar cell 10 are electrically connected through a contact electrode 13 provided on the surface of the plastic film substrate 12.

A transparent thin plastic film substrate 14 is located on the other surface of each of the solar cell 10, i.e., the surface opposite to the plastic film substrate 12 (hereinafter referred to as a rear surface). The plastic film substrate 14 is made of fluorocarbon resin, polycarbonate or polyethylene terephthalate, for example. A diffraction grating 15 is located between the plastic film substrate 14 and the solar cell 10.

Figure 3:
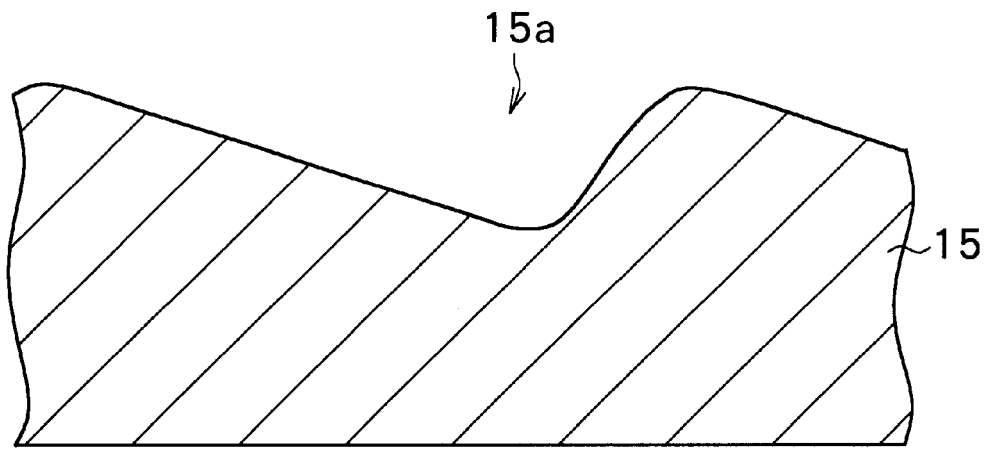
FIG. 3 is an enlarged cross sectional view of a part of a diffraction grating of the solar battery shown in FIG. 2.

The diffraction grating 15 has a reflection-type blazed grating (grating structure) made of a conductive material such as aluminum (Al), silver (Ag) and so on. A groove 15a of the diffraction grating 15 is substantially shaped like a sawtooth as shown in FIG. 3. The surface of the groove 15a is inclined to the surface of the overall grating. The groove 15a has a pitch d of, for example, 2.6 $\mu$m and a depth of, for example, 0.80 $\mu$m.

The diffraction grating 15 is formed in the following manner. A shape of a master of the diffraction grating 15 is transferred to an intermediate layer 16 made of thermosetting resin or thermoplastic resin having a refractive index of 1.5, for example. Then, the transferred grating grooves are filled with, for example, aluminum or silver by means of deposition, screen printing or the like. The diffraction grating 15 is bonded to the rear surfaces of the solar cell 10 sandwiching the intermediate layer 16 with a transparent adhesive 17. The adhesive 17 is made of, for example, thermosetting resin or thermoplastic resin, similarly to the intermediate layer 16. The plastic film substrate 14 is bonded to the rear surface of the diffraction grating 15. Ultrafine particles of titanium oxide $TiO_2$), for example, are mixed in the intermediate layer 16 and the adhesive 17 located between the diffraction grating 15 and the solar cell 10 in order to increase the respective refractive indices of the intermediate layer 16 and the adhesive 17. Consequently, the intermediate layer 16 and the adhesive 17 have a refractive index of 2.2, for instance.

Next, a method of manufacturing a solar battery of the embodiment will be specifically described with reference to FIGS. 5A to 8 and FIGS. 9A and 9B.

Figure 5A:
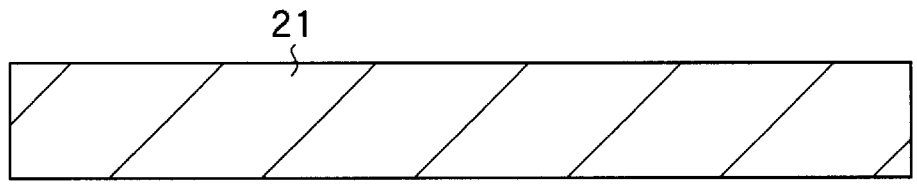
FIGS. 5A to 5D are cross sectional views of processes of manufacturing the integrated solar battery according to the first embodiment of the invention.
Figure 5B:
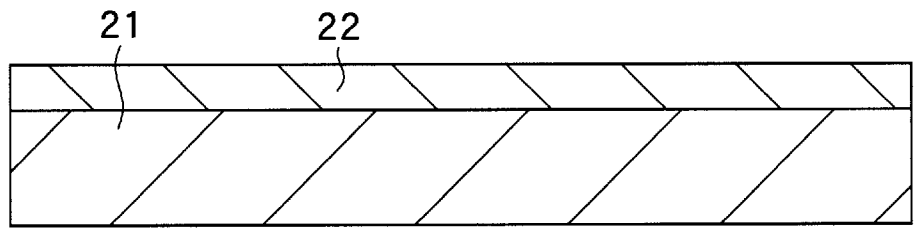

First, as shown in FIG. 5A, a silicon substrate 21 for forming a plurality of solar cell 10 is prepared. Single crystal silicon doped with a p type impurity such as boron and having resistivity of about 0.01 $\Omega$·cm to 0.02 $\Omega$·cm is used as the silicon substrate 21. Then, as shown in FIG. 5B, a porous silicon layer 22 is formed on the surface of the silicon substrate 21 by anodization, for example.

Anodization refers to a method in which the passage of current through a hydrofluoric acid solution using the silicon substrate 21 as an anode takes place. Anodization can be carried out by double cell method described in "Anodization of Porous Silicon" by Itoh et al., published in Surface Finishing Vol. 46, No. 5, pp. 8–13, 1995, for example. Herein, an electrolytic solution containing HF (hydrogen fluoride) and $C_2H_5OH$ (ethanol) at a ratio of 1 to 1, for example, is used as an electrolytic solution (an anodization solution). First-step anodization takes place for 8 minutes at a current density of about 0.5 $mA/cm^2$ to 3 $mA/cm^2$, for example, whereby a first porous layer having low porosity is formed. Subsequently, second-step anodization takes place for 8 minutes at a current density of 3 mA/cm$^2$ to 20 mA/cm$^2$, for example, whereby a second porous layer having intermediate porosity is formed. Furthermore, third-step anodization takes place for a few seconds at a current density of 40 mA/cm$^2$ to 300 mA/cm$^2$, for example, whereby a third porous layer having high porosity is formed. For information, the third porous layer becomes an isolation layer 22$a$ (see FIG. 5C) to be described later. Thus, the porous silicon layer 22 having a thickness of about 8 μm is formed of the first, second and third porous layers. Desirably, a p type single crystal silicon substrate is used as the silicon substrate 21 in that the porous silicon layer 22 is formed thereon by anodization. Alternatively, an n type single crystal silicon substrate may be used depending on set conditions.

Figure 5C:
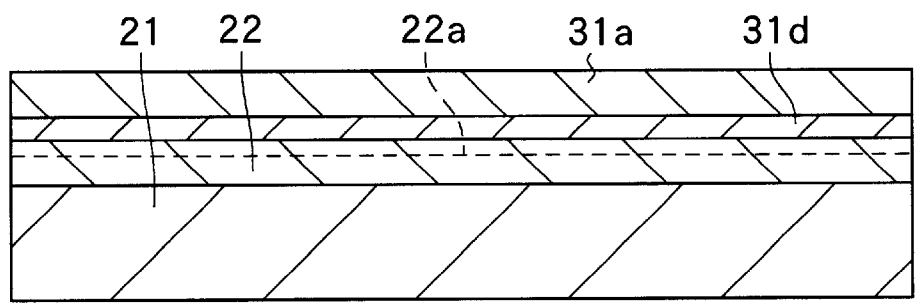

Subsequently, the solar cell 10 are formed on the porous silicon layer 22. That is, first, hydrogen annealing takes place for 30 minutes at a temperature of 1100° C., for example, thereby filling holes in the surface of the porous silicon layer 22. Then, as shown in FIG. 5C, for example, a semiconductor layer 31 composed of a p$^+$ type layer 31$d$ and a p type layer 31$a$ is epitaxial grown on the porous silicon layer 22 by using gas such as SiH$_4$ or SiCl$_4$. A growth temperature for epitaxial growth is set to 1070° C., for example, to use SiH$_4$ or to 1140° C., for example, to use SiCl$_4$.

During hydrogen annealing and epitaxial growth, silicon atoms in the porous silicon layer 22 are moved and rearranged. As a result, a portion having high porosity in the porous silicon layer 22 further greatly changes. Thus, a layer having the lowest tensile strength, i.e., the isolation layer 22$a$ is formed. It should be noted that the isolation layer 22$a$ has such a sufficient tensile strength that the p$^+$ type layer 31$d$ and the p type layer 31$a$ do not peel off the silicon substrate 21 in part or over the whole surface while the solar cell 10 are formed on the porous silicon layer 22.

Figure 5D:
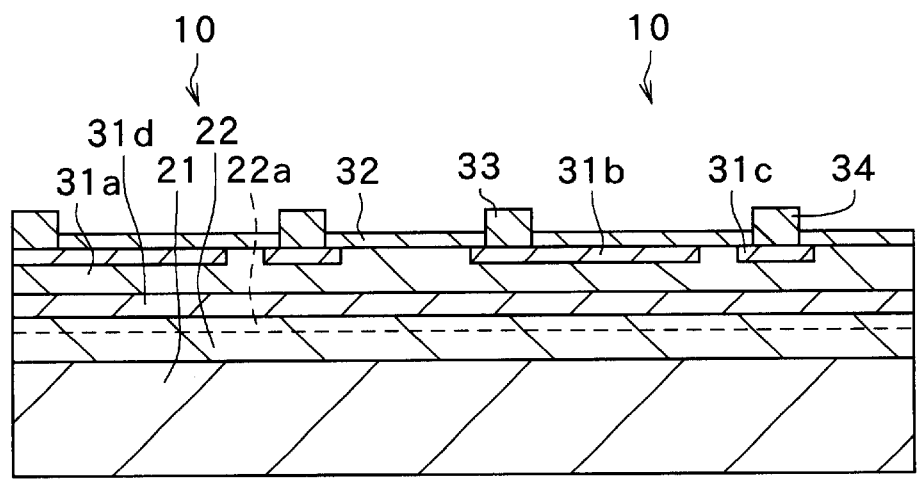

As shown in FIG. 5D, corresponding to a region where the solar cell 10 are formed, the p type layer 31$a$ is heavily doped with an n type impurity such as phosphorus by ion implantation, for instance, whereby an n$^+$ type layer 31$b$ of about 0.02 μm to 1 μm thick is formed. Moreover, the p type layer 31$a$ is heavily doped with a p type impurity such as boron by ion implantation, for instance, whereby a p$^+$ type layer 31$c$ of about 0.02 μm to 1 μm thick is formed. After the n$^+$ type layer 31$b$ and the p$^+$ type layer 31$c$ are formed, an antireflection film 32 made of titanium oxide is formed on the semiconductor layer 31 by sputtering, for example.

Then, regions of the antireflection film 32, i.e., the respective regions corresponding to the n$^+$ type layer 31$b$ and the p$^+$ type layer 31$c$ are selectively removed, whereby openings are formed. Then, a cathode 33 and an anode 34 made of aluminum are formed in the openings in the antireflection film 32 by sputtering, for example.

After the solar cell 10 are thus formed, as shown in FIG. 6A, the plastic film substrate 12 having a larger area than the silicon substrate 21 and made of fluorocarbon resin, polycarbonate or polyethylene terephthalate, for example, is prepared. The plastic film substrate 12 is bonded to the front surfaces of the solar cell 10 with an adhesive 35.

After the plastic film substrate 12 is bonded to the solar cell 10, as shown in FIG. 6B, the solar cell 10, together with the plastic film substrate 12, are peeled from the silicon substrate 21 by the isolation layer 22$a$. Then, the solar cell 10 are transferred to the plastic film substrate 12. For peeling, any one of the following three methods or a combination of plural ones of these methods is used: for example, a method in which a tensile stress is applied between the plastic film substrate 12 and the silicon substrate 21; a method in which the silicon substrate 21 is immersed into a solution such as water or ethanol and the strength of the isolation layer 22$a$ is weakened by ultrasound irradiation, whereby peeling takes place; or a method in which the strength of the isolation layer 22$a$ is weakened by centrifuging, whereby peeling takes place.

Figure 7A:
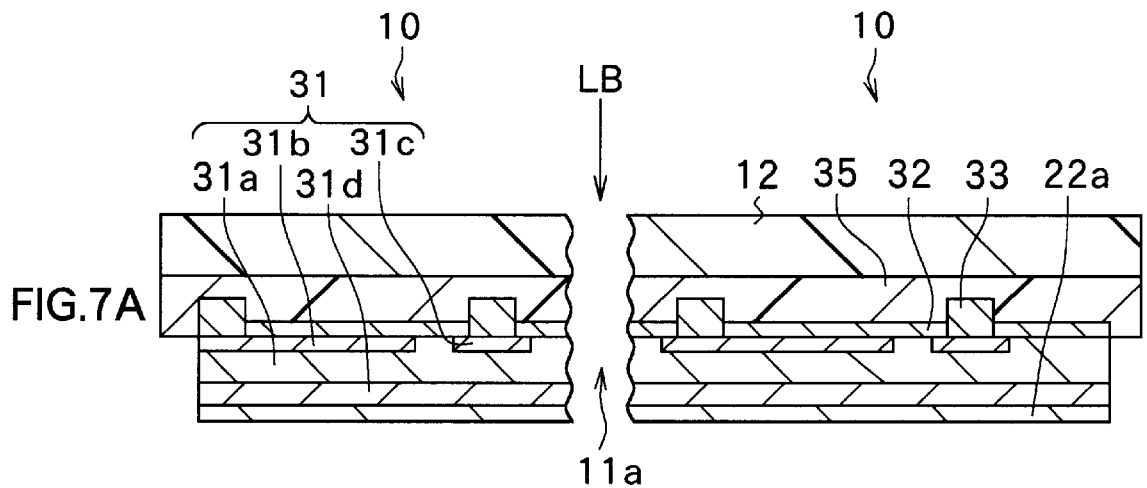
FIGS. 7A and 7B are cross sectional views of processes following the process of FIG. 6B.

After the solar cell 10 are transferred to the plastic film substrate 12, as shown in FIG. 7A, the side close to the plastic film substrate 12 is irradiated with a laser beam LB such as an excimer laser, whereby an isolation trench 11$a$ is formed. Thus, the solar cell 10 are separately isolated by the isolation trench 11$a$. As long as a region near an end surface of the plastic film substrate 12 is not cut off, the solar cell 10 do not peel off the plastic film substrate 12 because the individual solar cell 10 are bonded to the plastic film substrate 12.

Figure 9A:
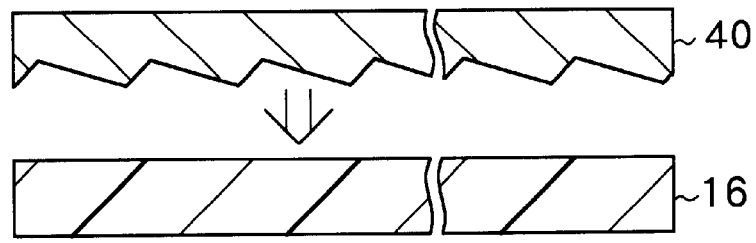
FIGS. 9A and 9B are cross sectional views for illustrating processes of manufacturing the diffraction grating according to the first embodiment of the invention.
Figure 9B:
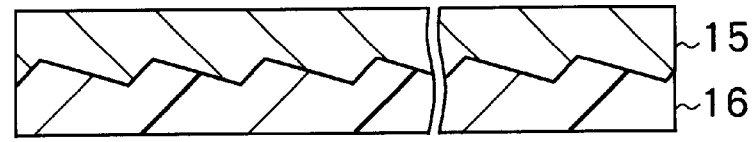

On the other hand, as shown in FIG. 9A, a master 40 of the diffraction grating is prepared, and the shape of the diffraction grating of the master 40 is transferred to the intermediate layer 16 made of thermosetting resin having a refractive index of 1.5, for example. Then, as shown in FIG. 9B, the transferred grooves are filled with a metal material such as aluminum by means of deposition, screen printing or the like, whereby the diffraction grating 15 is formed.

Figure 7B:
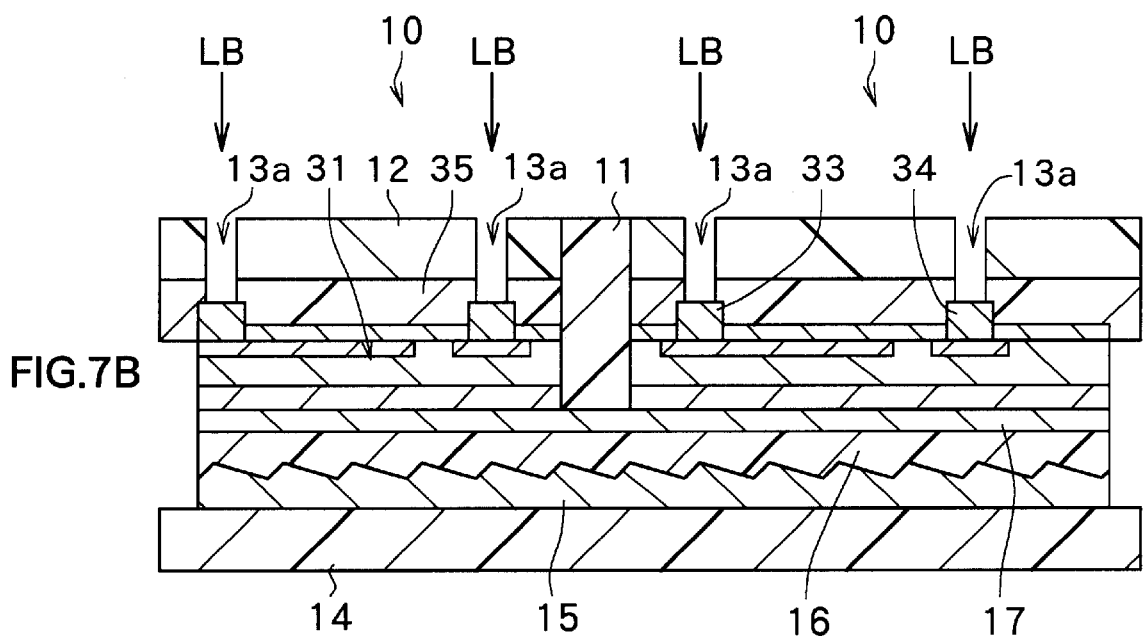
Figure 8:
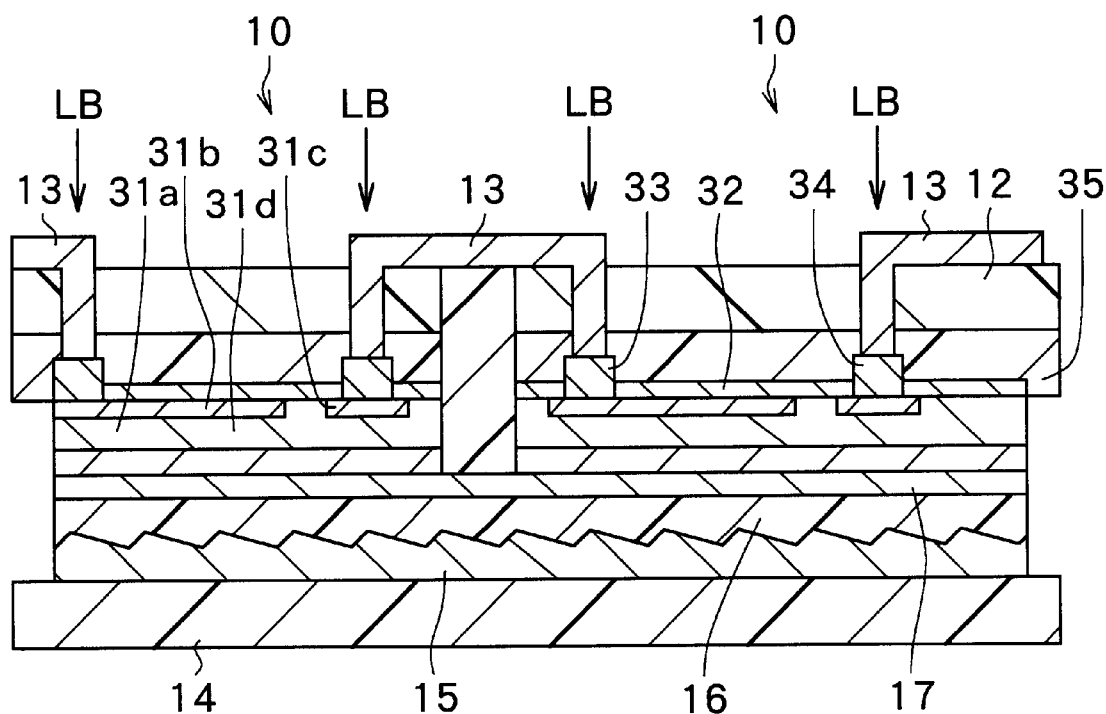
FIG. 8 is a cross sectional view of a process following the process of FIG. 7B.

As shown in FIG. 7B, the diffraction grating 15, together with the intermediate layer 16, is bonded to the rear surfaces of the solar cell 10 with the adhesive 17. Then, the isolation trench 11$a$ between the solar cell 10 is filled with a flexible, transparent insulating material, e.g., EVA, whereby the element isolation layer 11 is formed. After the element isolation layer 11 is formed, the side close to the plastic film substrate 12 is irradiated with the laser beams LB, e.g., CO$_2$ laser beams, whereby through holes 13$a$ reaching the cathode 33 and the anode 34 are formed. After the through holes 13$a$ are formed, as shown in FIG. 8, the contact electrode 13 made of silver paste is formed by, for instance, printing method so that the adjacent elements may be bonded to each other.

In the solar battery of the embodiment thus obtained, the incident light L$_{in}$ passes through the transparent plastic film substrate 12 and enters into the solar battery element 10, and part of the incident light L$_{in}$ is absorbed by the solar battery element 10. The light, which has not been absorbed by the solar battery element 10 but has passed through the solar battery element 10, is reflected by the diffraction grating 15. The reflected light again enters into the solar battery element 10 and then is absorbed. In the solar battery element 10 by which the light has been absorbed, a pair of electron and hole is generated in the n$^+$ type layer and the p type layer. Thus, a current proportional to the amount of incident light is generated, and the current is positioned from a lead electrode (not shown).

In the solar battery of the embodiment, the incident light L$_{in}$ is diffracted by the diffraction grating 15 and returns to the solar battery element 10. When a diffraction angle is more than a predetermined value, an angle between the diffracted light and a normal to the solar battery increases. Thus, the reflected light does not emit to the air but is totally reflected by a top surface of a silicon thin film layer (the solar battery element 10) or the surface of the transparent plastic film substrate 12 and returns to the solar battery element 10. The light is confined within the solar battery element 10 by repeating such a process of return of the light to the solar battery element 10. The light is thus confined within the solar battery element 10, whereby an optical path length in the silicon thin film increases. Thus, the amount of optical absorption increases and therefore the photoelectric conversion efficiency improves. In the embodiment, the diffraction grating 15 has the blazed grating structure as shown in FIG. 2, and thus the light can be concentrated on a specific diffraction order.

In the embodiment, a condition under which the light diffracted by the diffraction grating 15 is totally reflected in the solar battery element 10 is expressed by the following expression (1):

$$k \sin \theta_i \pm n_g K > k \qquad (1)$$

where $\theta_i$ denotes an angle of incidence of the light on the solar battery, d denotes a pitch of the diffraction grating, λ denotes a wavelength of the light and $n_g$ denotes a refractive index of a medium (here, the intermediate layer 16 and the adhesive 17) having the lowest refractive index between the diffraction grating 15 and the solar battery element 10. The refractive index of the air is assumed to be equal to 1.0.

In the above expression (1), $k=2\pi/\lambda$ and $K=2\pi/d$. It should be noted that $n_g$ must be lower than or approximately equal to the refractive index of a photoelectric conversion layer (the solar battery element 10), namely, silicon. If not so, the light, which is diffracted by the diffraction grating 15 and then returns to the solar battery element 10 at a great angle with the normal to the solar battery, may be totally reflected and return to the diffraction grating 15 before the light reaches the solar battery element 10. In this case, the diffracted light does not contribute to electric power generation. Generally, the material of thermoplastic resin, the adhesive or the like has lower refractive index than silicon.

Assuming that n denotes the refractive index of an outermost layer (the plastic film substrate 12 in the embodiment) in the solar battery and θ denotes an angle between the direction of travel of the light traveling through the outermost layer and the normal to the solar battery, a condition expressed by the following expression (2) must be satisfied in order that the traveling light may be totally reflected by an boundary surface with the air and be confined within the solar battery.

$$n \sin \theta > 1 \qquad (2)$$

On the other hand, the blazed grating has a problem: as an incident angle with the diffraction grating increases, the diffraction efficiency of primary light gradually decreases. Assuming that $n_m$ denotes a refractive index of the layer having the highest refractive index of the layers such as the silicon thin film making the solar battery and Θm denotes an angle of the light in the layer having the highest refractive index, the following equation (3) is formulated. Thus, the layer on the diffraction grating has a high refractive index, but the incident angle with the diffraction grating decreases.

$$n_m \sin \Theta_m = n_g \sin \Theta_i \qquad (3)$$

In other words, when the refractive index of the layer on the diffraction grating is high, the light is more efficiently concentrated on the primary light and thus the light can be efficiently confined within the solar battery. Here, the following equations (4) and (5) are formulated:

$$n_G \sin \Theta_i = \sin \theta_i \qquad (4)$$

$$n_G k \sin \Theta_o = n_G k \sin \Theta_i + K \qquad (5)$$

where $\Theta_i$ denotes an incident angle with the diffraction grating, $\Theta_o$ denotes an angle of the primary diffracted light and $n_G$ denotes a refractive index of the medium on the diffraction grating.

Also for this reason, it is desirable that the refractive index is increased in the case where the blazed grating is used as the diffraction grating 15 as in the case of the embodiment. Specifically, ultrafine particles of a substance with a high refractive index, such as titanium oxide, are mixed into thermoplastic resin or thermosetting resin to which the diffraction grating is to be transferred, whereby the refractive index of the resin is increased. It should be noted that the refractive index of the resin must be lower than that of silicon as mentioned above. In the embodiment, it is desirable that a wavelength range for optimizing the diffraction efficiency of the blazed grating is the same as a transmission wavelength range of the solar battery. For example, the depth of the groove 15a is expressed as $1/(2\lambda_0)$, where $\lambda_0$ denotes a center wavelength of the light passing through the solar battery element 10. Thus, the shape of the diffraction grating is optimized for the light having a wavelength range within which the light is a little absorbed by the material of the solar battery such as silicon and passes through a thin film solar battery. Higher photoelectric conversion efficiency is therefore obtained.

Table 1 shows values of the diffraction efficiency of the diffraction grating 15 of the embodiment, which are calculated by Waterman and Rayleigh methods.

TABLE 1

Diffraction efficiency of perfect conductor diffraction grating

| | θ | | | | | |
|---|---|---|---|---|---|---|
| | 0 | | 34 | | 67 | |
| n | s | p | s | p | s | p |
| −12 | | | | | 0.00145 | 0.0000228 |
| −11 | | | | | 0.0321 | 0.00253 |
| −10 | | | | | 0.0871 | 0.0388 |
| −9 | | | 0.215 | 0.0268 | 0.138 | 0.139 |
| −8 | | | 0.0272 | 0.174 | 0.150 | 0.192 |
| −7 | | | 0.0339 | 0.109 | 0.113 | 0.130 |
| −6 | 0.0262 | 0.0109 | 0.0552 | 0.0629 | 0.0636 | 0.0494 |
| −5 | 0.0605 | 0.143 | 0.0682 | 0.0489 | 0.0454 | 0.0485 |
| −4 | 0.0830 | 0.0375 | 0.0497 | 0.0585 | 0.0625 | 0.105 |
| −3 | 0.0359 | 0.0493 | 0.0272 | 0.0633 | 0.0826 | 0.123 |
| −2 | 0.0424 | 0.00461 | 0.0204 | 0.0982 | 0.0839 | 0.0942 |
| −1 | 0.0362 | 0.0209 | 0.0284 | 0.110 | 0.0708 | 0.0464 |
| 0 | 0.00679 | 0.0235 | 0.0436 | 0.0999 | 0.0511 | 0.00432 |
| 1 | 0.0139 | 0.0132 | 0.0724 | 0.0727 | | |
| 2 | 0.0669 | 0.0606 | 0.346 | 0.0759 | | |
| 3 | 0.369 | 0.365 | | | | |
| 4 | 0.253 | 0.263 | | | | |
| 5 | 0.00528 | 0.00839 | | | | |
| 6 | 0.000208 | 0.000267 | | | | | n: Diffraction order,
θ: Incident angle,
s and p: Polarized light,
Unit: arcdeg, Wavelength of light: 900 nm Here, it is assumed that the refractive index of the plastic film substrate 12 is equal to 1.5, the respective refractive indices of the intermediate layer 16 and the adhesive 17 are equal to 2.2, the diffraction grating 15 is made of a perfect conductor and the light has a wavelength of 900 nm. The incident angles θ with the diffraction grating, θ=0 deg, 34 deg and 67 deg, refer to an angle at which the incident light is diffracted with maximum diffraction efficiency calculated from the incident angle with the solar battery and an angle of inclination of the surface on which the groove 15a of the diffraction grating 15 is formed, i.e., an angle at which the light is again incident on the diffraction grating 15 after the light is totally reflected by the silicon thin film or a protective film (the transparent plastic film substrate 12); and an angle at which the light is further again incident on the diffraction grating 15 after another diffraction and total reflection. It should be noted that the angles of diffracted light of orders calculated from the pitch of the diffraction grating do not exactly match these angles. As can be seen from Table 1, the tertiary light and the quaternary light among the diffracted light having an incident angle of 0 deg have the highest diffraction efficiency. The sum of the diffraction efficiencies is equal to 0.625. Considering that the refractive indices of thermosetting resin and the adhesive are equal to 2.2, the tertiary light has a diffraction angle of 27.9 deg. Thus, the tertiary light is reflected by the top surface of the silicon thin film. Therefore, the tertiary light and the quaternary light do not emit from the solar battery. The order of the diffracted light not totally reflected ranges from −2 to 2. The sum of the diffraction efficiencies is as low as 0.145. Accordingly, the sum of the diffraction efficiencies of the other diffracted light, 0.855 does not allow the light to emit from the solar battery.

The diffraction efficiency, with which the tertiary and the quaternary lights are again diffracted after total reflection, is approximately equal to the diffraction efficiency obtained at an incident angle of 34 deg. In this case, as can be seen from Table 1, it is the secondary light that has the highest diffraction efficiency. Since the secondary diffracted light is also totally reflected by the top surface of the silicon thin film, this light does not emit from the solar battery. The order of diffracted lights, which are not totally reflected after the diffraction and emit from the solar battery, ranges from −6 to 2. The sum of the diffraction efficiencies is as small as 0.276, as in the case of an incident angle of 0 deg. In the case of an incident angle of 67 deg, there is no diffraction order in which the diffraction efficiency is clearly maximized. The diffraction order of lights, which are not totally reflected and emit from the solar battery, ranges from −8 to 4. Since the sum of the diffraction efficiencies of these diffracted lights is equal to 0.480, a proportion of the light confined by total reflection is equal to 0.520. Therefore, an incident angle of 67 deg is not expected to increase optical absorption, compared to an incident angle of 34 deg.

Figure 4:
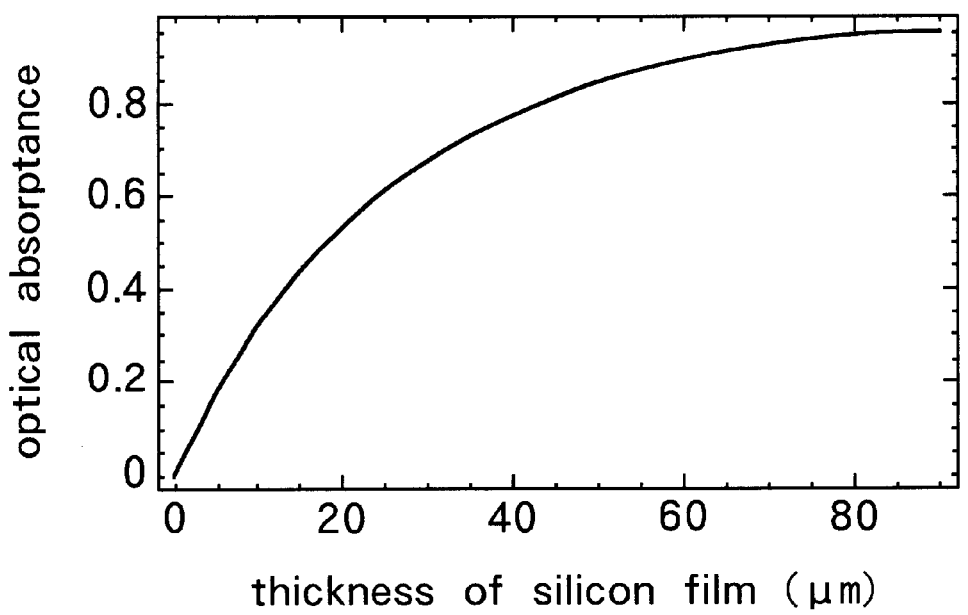
FIG. 4 is a graph of optical absorption properties in silicon.

As can be seen from the above description, the diffraction grating 15 of the blazed grating structure is bonded to the rear surface of the solar battery, whereby the light is confined within the solar battery and thus electric power can be efficiently generated. When an imaginary part of a complex index of refraction of silicon is set to 0.00275, the optical absorptance is changed as shown in FIG. 4 in response to a change in the thickness of the silicon thin film. It is assumed that a single crystal silicon thin film has a thickness of 10 $\mu$m, the light has an incident angle of 0 deg, the light incident on the diffraction grating after a first total reflection has an angle of 34 deg and the light incident on the diffraction grating after a second total reflection has an angle of 67 deg. In this case, the optical path length in the silicon thin film becomes equal to 53.3 $\mu$m in the meantime until a third incidence of the light on the diffraction grating. At this time, the optical absorptance is equal to 0.87 as shown in FIG. 4. For reference purposes, consider the case where without the diffraction grating, the light entering into the solar battery passes through the solar battery as it is. In this case, the optical absorptance is equal to 0.32 as shown in FIG. 4. It can be therefore seen that the light is totally reflected only twice by the top surface of the silicon thin film, whereby the optical absorptance increases by 2.72 (=0.87/0.32) times and thus the light is substantially absorbed by the solar battery. It can be seen from the above description that the structure of the embodiment allows two-time or more increase in a magnitude of optical absorption of the solar battery and, as a result, the efficiency of electric power generation is markedly improved.

[Second Embodiment]

Figure 10:
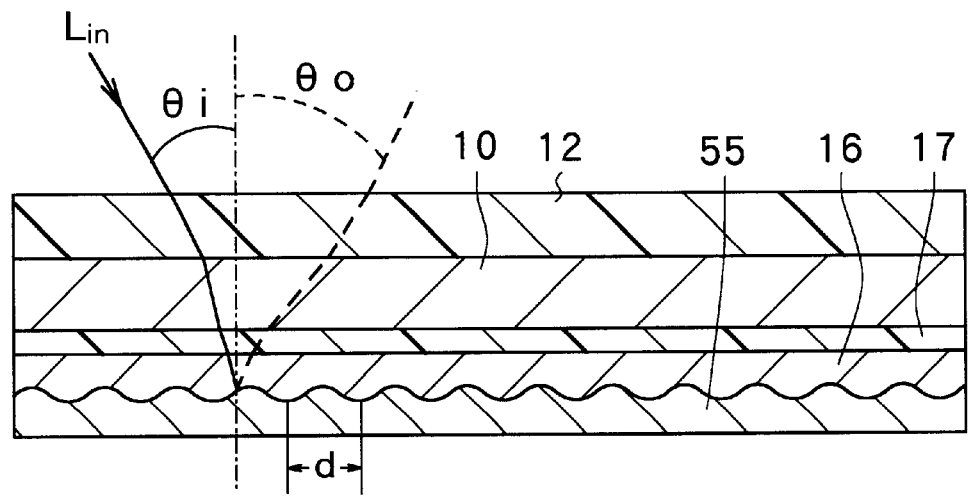
FIG. 10 is a cross sectional view for illustrating a configuration of an integrated solar battery according to a second embodiment of the invention.

FIG. 10 shows the structure of an integrated solar battery according to a second embodiment of the invention. The integrated solar battery has the same configuration as the first embodiment except that the solar battery is provided with a hologram 55 as a diffraction function layer, instead of the diffraction grating 15 of the first embodiment. Accordingly, the same components as the first embodiment are indicated by the same reference numerals and symbols, and the description thereof is omitted.

Figure 11:
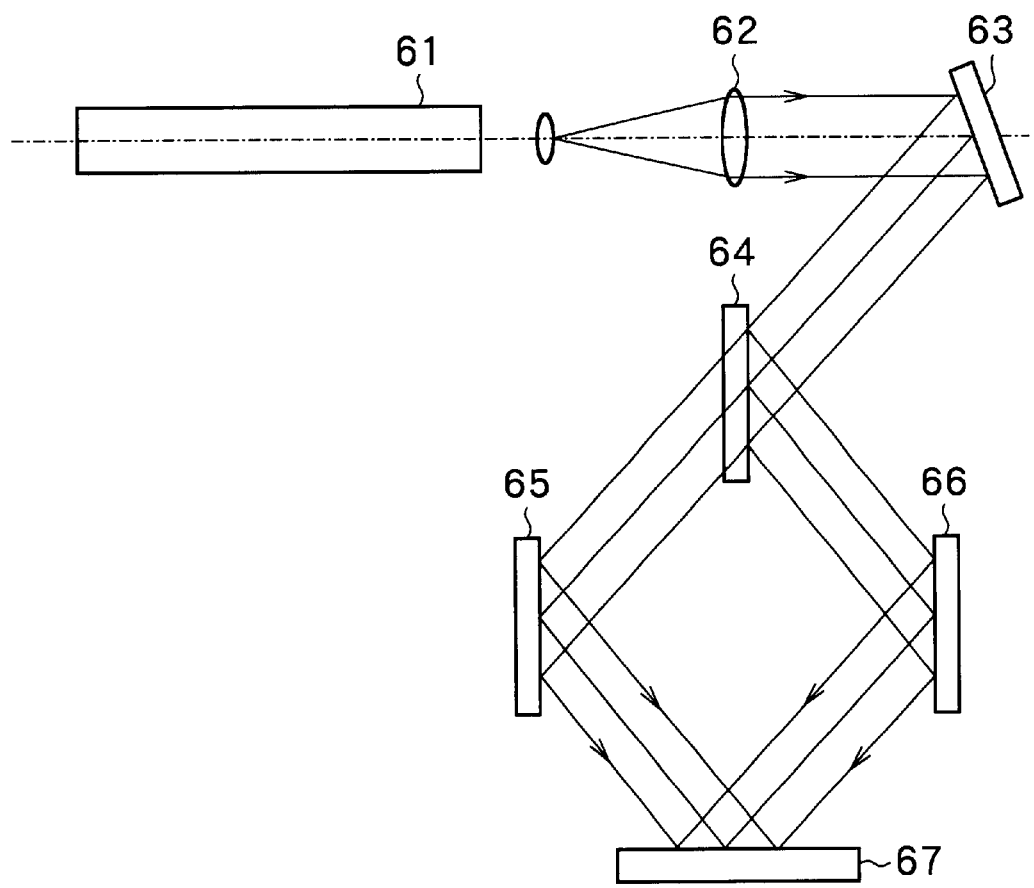
FIG. 11 is a cross sectional view for illustrating a method of manufacturing a hologram shown in FIG. 10.

The hologram 55 comprises a reflection-type hologram whose groove is wave-shaped in cross section, for example. The hologram 55 can be made by utilizing optical technology. Specifically, for example, as shown in FIG. 11, a beam diameter of a light beam emitted from a laser 61, a light source is increased by using a collimator lens 62. The emitted light beam is reflected toward a beam splitter 64 by a mirror 63, and then the emitted light beam is split into two light beams by the beam splitter 64. Then, the two emitted light beams are reflected toward a resist-coated photoconductor 67 by using the mirrors 65 and 66, and the emitted light beams are allowed to interfere with each other on the photoconductor 67. Thus, a distribution of projections and depressions is recorded on the photoconductor 67 in response to a distribution of intensity of interference. Then, the surface of the photoconductor 67 is plated with nickel, and the resist is dissolved and removed, whereby a master of the hologram 55 is made. Furthermore, the shape of the master is transferred to the intermediate layer 16, and the surface of the intermediate layer 16 is coated with a metal material such as aluminum, whereby the hologram 55 is formed.

Also in the embodiment, the condition for total reflection is expressed by the above expression (1), similarly to the first embodiment. In the expression, $\theta_i$ denotes an angle of incidence of the light $L_{in}$ on the solar battery, d denotes a pitch of the hologram 55, $\lambda$ denotes a wavelength of the light, $n_g$ denotes a refractive index of the medium (here, the intermediate layer 16 and the adhesive 17) having the lowest refractive index between the hologram 55 and the solar battery element 10, and the refractive index of the air is assumed to be equal to 1.0. The higher $n_g$, the wider the range of $\theta$ for satisfying the condition under which the light diffracted by the hologram 55 is confined within the solar battery by total reflection. Therefore, as $n_g$ becomes higher, the photoelectric conversion efficiency increases. Similarly to the first embodiment, it is therefore effective that the refractive index is increased by mixing ultrafine particles of a substance with a high refractive index such as titanium oxide ($TiO_2$) into the intermediate layer 16 and the adhesive 17.

In the embodiment, the hologram 55 comprises a phase grating whose structure of projections and depressions changes periodically. In this case, it is possible to reduce the intensity of zero order light within a specific range of wavelengths. It is, however, difficult to obtain such a hologram that the intensity of the zero order light of the light with all wavelengths of the light having a wide spectrum such as sunlight decreases. However, the shorter the wavelength of the light is, the higher the optical absorptance of silicon is. Thus, the thickness of the silicon thin film is increased, whereby the light with a short wavelength is gradually absorbed by the silicon thin film and does not pass through the silicon thin film. Therefore, any hologram will do as long as it can diffract only the light with a long wavelength passing through the silicon thin film. Any hologram structure will do as long as it has such a diffraction structure that the zero order light of the light having only the long wavelength range decreases.

Although the invention has been described above by referring to the embodiments, the invention is not limited to the above-described embodiments and various modifications thereof are possible. For example, the diffraction grating 15 is shaped like a sawtooth and the hologram 55 is wave-shaped in the above-described embodiments, but any shape will do as long as it permits total reflection. Moreover, the invention is applicable to a thin film semiconductor device other than the thin film solar battery.

As described above, according to a thin film semiconductor device or a method of manufacturing a thin film semiconductor device of the invention, the diffraction function layer is located on one surface of the photoelectric conversion layer opposite to the other surface on which the light is incident. Thus, the condition under which the light is totally reflected toward the photoelectric conversion layer is set, whereby the optical absorptance of the photoelectric conversion layer is increased and therefore the photoelectric conversion efficiency is improved. Accordingly, even if the thickness of the photoelectric conversion layer such as silicon is reduced, it is possible to achieve the photoelectric conversion efficiency that is substantially equal to the photoelectric conversion efficiency obtained by a thick photoelectric conversion layer and to reduce manufacturing costs.

More particularly, according to a method of manufacturing a thin film semiconductor device of the invention, since the diffraction function layer is made by transferring the master to thermoplastic resin or thermosetting resin, the thin film semiconductor device can be manufactured inexpensively.

Obviously many modifications and variations of the present invention are possible in the light of the above teachings. It is therefore to be understood that within the scope of the appended claims the invention may be practiced otherwise than as specifically described.

What is claimed is:

1. A thin film semiconductor device comprising:
   a solar cell having a photoelectric conversion layer for converting incident light into an electric signal;
   a diffraction function layer, made of a light reflecting material, located on one side of the solar cell opposite to the other side on which the light is incident, for reflecting the light passing through the photoelectric conversion layer toward the photoelectric conversion layer; and
   an intermediate layer, made of transparent resin, formed into one piece with the diffraction function layer on a surface of the diffraction function layer facing the solar cell, and the intermediate layer is bonded to the solar cell with an adhesive made of a transparent resin.

2. A thin film semiconductor device according to claim 1, wherein the following expression is satisfied:

$$k \sin \theta_i \pm n_g K > k$$

where $k=2\pi/\lambda$, $K=2\pi/d$, $\theta_i$ denotes an angle of incidence of the light on the photoelectric conversion layer, d denotes a pitch of the diffraction function layer, $\lambda$ denotes a wavelength of the light and $n_g$ denotes a refractive index of a medium having the lowest refractive index between the diffraction function layer and the photoelectric conversion layer.

3. A thin film semiconductor device according to claim 1, wherein the resin making the intermediate layer and the adhesive have a lower refractive index than the photoelectric conversion layer.

4. A thin film semiconductor device according to claim 3, wherein the resin making the intermediate layer and the adhesive contain ultrafine particles for increasing the refractive index.

5. A thin film semiconductor device according to claim 5, wherein a groove making the diffraction function layer has a sawtooth cross section.

6. A thin film semiconductor device according to claim 5, wherein a depth of the groove making the diffraction function layer is expressed as $1/(2\lambda_0)$, where $\lambda_0$ denotes a center wavelength of the light passing through the photoelectric conversion layer.

7. A thin film semiconductor device according to claim 1, wherein the diffraction function layer comprises a diffraction grating.

8. A thin film semiconductor device according to claim 1, wherein the diffraction function layer comprises a hologram.

9. A thin film semiconductor device according to claim 1, wherein the photoelectric conversion layer comprises a thin film solar battery element.

10. A method of manufacturing a thin film semiconductor device comprising a solar cell having a photoelectric conversion layer for converting incident light into an electric signal and a diffraction function layer for reflecting the light passing through the photoelectric conversion layer toward the photoelectric conversion layer, the method comprising the steps of:
    pressing a master of the diffraction function layer on a transparent thermoplastic resin layer or a transparent thermosetting resin layer and thereby transferring a shape of the diffraction function layer to the resin layer, and then filling a light reflecting material into a transfer surface of the resin layer, thereby forming a reflection diffraction function layer; and
    bonding the diffraction function layer to one surface of the solar cell opposite to the other surface on which the light is incident.

* * * * *